(12) United States Patent
Jang

(10) Patent No.: US 7,616,032 B2
(45) Date of Patent: Nov. 10, 2009

(54) INTERNAL VOLTAGE INITIALIZING CIRCUIT FOR USE IN SEMICONDUCTOR MEMORY DEVICE AND DRIVING METHOD THEREOF

(75) Inventor: Ji-Eun Jang, Ichon-shi (KR)

(73) Assignee: Hynix Semiconductor Inc., Ichon-Shi, Kyungki-Do (KR)

( * ) Notice: Subject to any disclaimer, the term of this patent is extended or adjusted under 35 U.S.C. 154(b) by 199 days.

(21) Appl. No.: 11/015,473

(22) Filed: Dec. 20, 2004

(65) Prior Publication Data

US 2005/0141319 A1 Jun. 30, 2005

(30) Foreign Application Priority Data

Dec. 30, 2003 (KR) .................. 10-2003-0100447

(51) Int. Cl.
*H03L 7/00* (2006.01)
(52) U.S. Cl. .................. 327/143; 327/537; 327/544
(58) Field of Classification Search .................. 327/143, 327/198, 544, 537
See application file for complete search history.

(56) References Cited

U.S. PATENT DOCUMENTS

| | | | | |
|---|---|---|---|---|
| 4,950,920 A * | 8/1990 | Hara et al. | .................. | 327/257 |
| 5,781,490 A * | 7/1998 | Ma et al. | .................. | 365/226 |
| 5,852,378 A * | 12/1998 | Keeth | .................. | 327/171 |
| 5,942,932 A * | 8/1999 | Shen | .................. | 327/530 |
| 6,169,421 B1 * | 1/2001 | Bryan et al. | .................. | 326/83 |
| 6,744,301 B1 * | 6/2004 | Tschanz et al. | .................. | 327/534 |
| 2002/0159322 A1 * | 10/2002 | Choi et al. | .................. | 365/226 |
| 2004/0012419 A1 * | 1/2004 | Kim et al. | .................. | 327/143 |
| 2004/0232957 A1 * | 11/2004 | Do | .................. | 327/143 |

* cited by examiner

*Primary Examiner*—Quan Tra
(74) *Attorney, Agent, or Firm*—Lowe Hauptman Ham & Berner, LLP

(57) ABSTRACT

Provided are an internal voltage initializing circuit for use in a semiconductor memory and a driving method thereof, which are capable of preventing a back bias voltage from abnormally increasing due to a pumping operation of a VPP pump according to a change in a level of a power-up signal. The internal voltage initializing circuit includes: a high voltage initializing unit for selectively connecting a power supply voltage terminal an a high voltage terminal in response to a power-up signal; and a back bias voltage initializing unit for selectively connecting a ground terminal and a back bias voltage terminal in response to a signal produced by delaying the power-up signal by a predetermined time.

12 Claims, 5 Drawing Sheets

INTERNAL VOLTAGE INITIALIZING CIRCUIT FOR USE IN SEMICONDUCTOR MEMORY DEVICE AND DRIVING METHOD THEREOF

FIELD OF INVENTION

The present invention relates to a semiconductor memory device; and, more particularly, to an internal voltage initializing circuit for use in a semiconductor memory device and a driving method thereof.

DESCRIPTION OF PRIOR ART

A semiconductor memory device includes various types of logics and internal voltage generation blocks for stable operation. The logics must be initialized to a specific value before a memory device starts to operate with a voltage supply. In the case of an internal voltage, the internal voltage generator supplies a bias voltage to power terminals of memory internal logics. If the internal voltage does not have an appropriate voltage level when a power supply voltage (VDD) is supplied, a latch-up problem occurs and thus reliability cannot be secured. In order to prevent the latch-up due to the initialization of the memory internal logics and the instability of the internal voltage, the semiconductor memory device requires a power-up circuit.

In the initialization of the semiconductor memory device, when the power supply voltage (VDD) is applied from an external circuit, the power-up circuit causes the memory internal logics not to operate in response to the power supply voltage level but to operate after the power supply voltage (VDD) level rises above a predetermined threshold level.

A power-up signal outputted from the power-up circuit maintains a logic low level during a period when the power supply voltage (VDD) is lower than the threshold level, and changes to a logic high level when the power supply voltage (VDD) is stabilized at a level higher than the threshold level.

When the power-up signal is at a logic low level after the power supply voltage (VDD) is supplied, latches of the memory internal logic are initialized to a predetermined level. At this time, the internal voltage generating blocks are initialized.

The threshold level of the power supply voltage is a voltage level required for normal switching operation of the logics and is designed to have a more margin than a threshold voltage of a MOS transistor. In general, if a power-up trigger level is set to the threshold voltage of the MOS transistor, there is no problem in the initialization. However, in the case of the internal voltage circuit (for example, a booster circuit such as a VPP generator) configured with analog circuits, an operation efficiency decreases and the latch-up may occur after the power-up trigger. For these reasons, the power-up trigger level is designed to have a more margin than the threshold voltage of the MOS transistor so that the analog circuits can generate stable values.

Meanwhile, reservoir capacitors are arranged in a peripheral circuit area of the semiconductor memory device in order for the stabilization of the power supply voltage (VDD) from noise. The reservoir capacitors are implemented with wells and receive high voltage (VPP) and back bias voltage (VBB). Therefore, the reservoir capacitors are also called VPP-VBB capacitors.

For example, in order to reduce an OFF leakage current in a DRAM cell area, a triple well is formed by forming a deep N well at a cell area and forming a P well inside the deep N well. In this case, the high voltage (VPP) is applied to the N well and the back bias voltage (VBB) is applied to the P well. At this time, a P-N junction exists between the high voltage (VPP) and the back bias voltage (VBB). In general, the high voltage (VPP) is about 3.5 V and the back bias voltage (VBB) is about −0.8 V. Therefore, a reverse depletion region is formed and a depletion capacitor exists.

Meanwhile, the semiconductor memory device uses high voltage (VPP), back bias voltage (VBB) and core voltage (VCORE) as the internal voltage. These voltages are generated from the internal voltage generating blocks and need to be initialized during the power-up operation. Each of the internal voltage generating blocks includes an internal voltage initializing circuit.

FIG. 1 is a circuit diagram of a conventional internal voltage initializing circuit.

Referring to FIG. 1, the conventional internal voltage initializing circuit includes a VPP initializing unit 100, a VBB initializing unit 110, and a VCORE initializing unit 120.

The VPP initializing unit 100 includes a level shifter 10 receiving a power-up signal pwrup, an inverter INV1 receiving an output signal of the level shifter 10, an inverter INV2 receiving an output signal of the inverter INV1, and a PMOS transistor MP1 connected between a VDD terminal and a VPP terminal. The PMOS transistor MP1 has a gate receiving an output signal of the inverter INV2. Here, the level shifter 10 is provided for increasing the high level (VDD level) of the power-up signal pwrup to the VPP level.

The VBB initializing unit 110 includes a inverter INV3 receiving the power-up signal pwrup, a inverter INV4 receiving an output signal of the inverter INV3, a PMOS transistor MP2 connected between the VDD terminal and a node N1 and having a gate receiving an output signal of the inverter INV4, an NMOS transistor MN1 connected between the VBB terminal and the node N1 and having a gate receiving an output signal of the inverter INV4, and an NMOS transistor MN2 connected between a ground terminal (VSS) and the VBB terminal and having a gate receiving a signal outputted through the node 1. Here, the inverters INV3 and INV4 constitute a buffer, and the PMOS transistor MP2 and the NMOS transistor MN1 constitutes an inverter.

The VCORE initializing unit 120 includes a inverter INV5 receiving the power-up signal pwrup, a inverter INV6 receiving an output signal of the inverter INV5, and a PMOS transistor MP3 connected between the VDD terminal and the VCORE terminal and having a gate receiving an output signal of the inverter INV6.

FIG. 2A is an ideal timing diagram of the conventional internal voltages shown in FIG. 1.

Referring to FIG. 2A, in a time period when the power supply voltage (VDD) does not reach a specific level (about 1.3 V), the power-up signal pwrup maintains a logic low level.

If the power-up signal pwrup is a logic low level, the PMOS transistor MP1 of the VPP initializing unit 100 is turned on to connect the VDD terminal and the VPP terminal, and the NMOS transistor MN2 of the VBB initializing unit 110 is turned on to connect the VSS terminal and the VBB terminal. Also, the PMOS transistor MP3 of the VCORE initializing unit 120 is turned on to connect the VDD terminal and the VCORE terminal.

Therefore, in the time period when the power-up signal pwrup is a logic low level, the high voltage (VPP) and the core voltage (VCORE) rise along the VDD level and the back bias voltage (VBB) becomes the ground voltage (VSS).

If the power supply voltage (VDD) continues to rise and then reaches the specific level (about 1.3 V), the power-up signal pwrup changes to a logic high level.

If the power-up signal pwrup becomes a logic high level, the PMOS transistor MP1 of the VPP initializing unit 100 is turned off to disconnect the VDD terminal and the VPP terminal. Thus, a VPP pump (not shown) performs a pumping operation and rises its own target level (3.3 V). The NMOS transistor MN2 of the VBB initializing unit 110 is turned off to disconnect the VSS terminal and the VBB terminal. Thus, a VBB pump (not shown) performs a pumping operation and falls down its own target level (−0.8 V).

Also, the PMOS transistor MP3 of the VCORE initializing unit 120 is turned off to disconnect the VDD terminal and the VCORE terminal and is set to its own target level (1.6 V) by a VCORE driver (not shown).

FIG. 2B is an actual timing diagram of the internal voltages shown in FIG. 1.

Referring to FIG. 2B, at a time point when the power-up signal pwrup changes to the logic high level and the VPP pump and the VBB pump start the pumping operations, the VPP level rapidly increases due to the VPP pumping operation that is relatively stronger than the VPP pumping operation. In this case, due to the reservoir capacitor (with a relatively large capacitance) connected between the VPP terminal and the VBB terminal, potential of the VPP terminal also increases to a positive level (refer to a portion "A" of FIG. 2B). This phenomenon may cause the latch-up in the memory cell area so as to deteriorate reliability and operational property of the semiconductor memory device.

SUMMARY OF INVENTION

It is, therefore, an object of the present invention to provide an internal voltage initializing circuit and a driving method thereof, which are capable of preventing a back bias voltage from abnormally increasing due to a pumping operation of a VPP pump according to a change in a level of a power-up signal.

In accordance with an aspect of the present invention, there is provided an internal voltage initializing circuit for use in a semiconductor memory device, including: a high voltage initializing unit for selectively connecting a power supply voltage terminal an a high voltage terminal in response to a power-up signal; and a back bias voltage initializing unit for selectively connecting a ground terminal and a back bias voltage terminal in response to a signal produced by delaying the power-up signal by a predetermined time.

In accordance with another aspect of the present invention, there is provided a driving method of an internal voltage initializing circuit for use in a semiconductor memory device includes the steps of: connecting a power supply voltage and a high voltage terminal, and connecting a ground terminal and a back bias voltage terminal; disconnecting the power supply voltage terminal and the voltage terminal; and disconnecting the ground voltage terminal and the back bias voltage after a predetermined time from a time point when the power supply voltage terminal and the high voltage terminal are disconnected.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device incorporating therein an internal voltage initializing circuit and a driving method thereof in accordance with a preferred embodiment of the present invention will be described in detail referring to the accompanying drawings.

Figure 3:
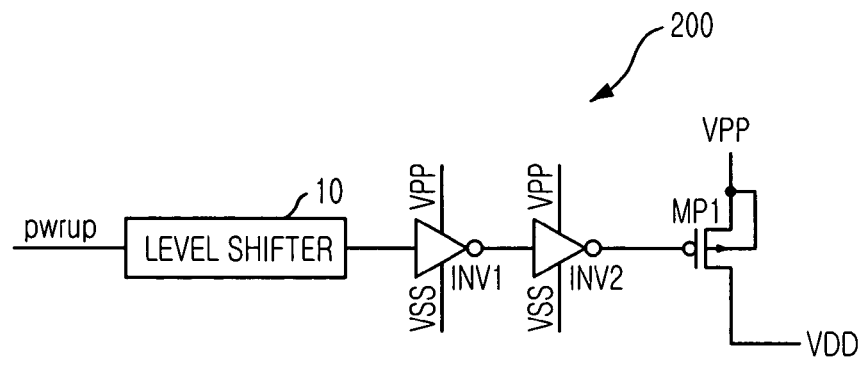
FIG. 3 is a circuit diagram of an internal voltage initializing circuit in accordance with an embodiment of the present invention.
Figure 3:
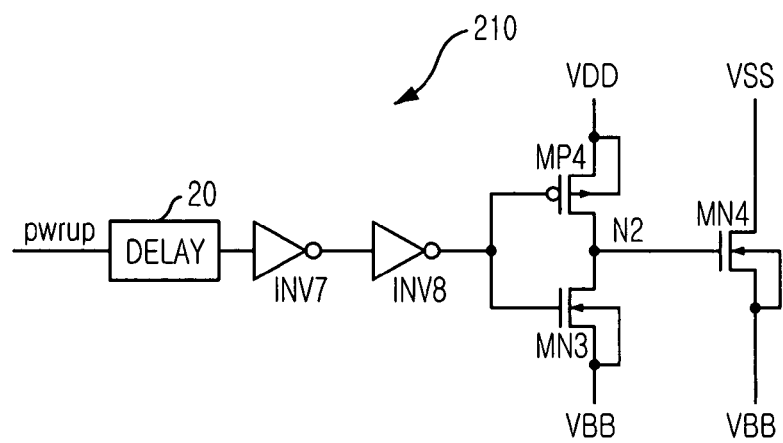
Figure 3:
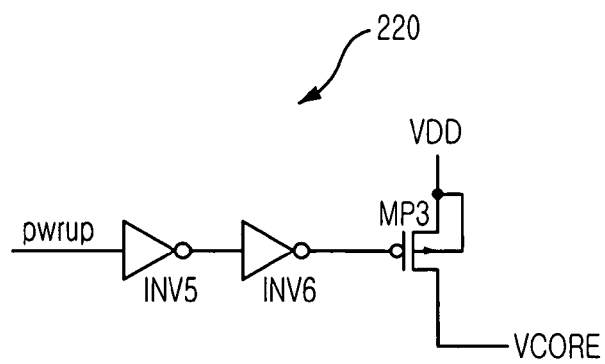

FIG. 3 is a circuit diagram of an internal voltage initializing circuit in accordance with the preferred embodiment of the present invention.

Referring to FIG. 3, the internal voltage initializing circuit includes a high voltage (VPP) initializing unit 200, a back bias voltage (VBB) initializing unit 210, and a core voltage (VCORE) initializing unit 220.

Figure 1:
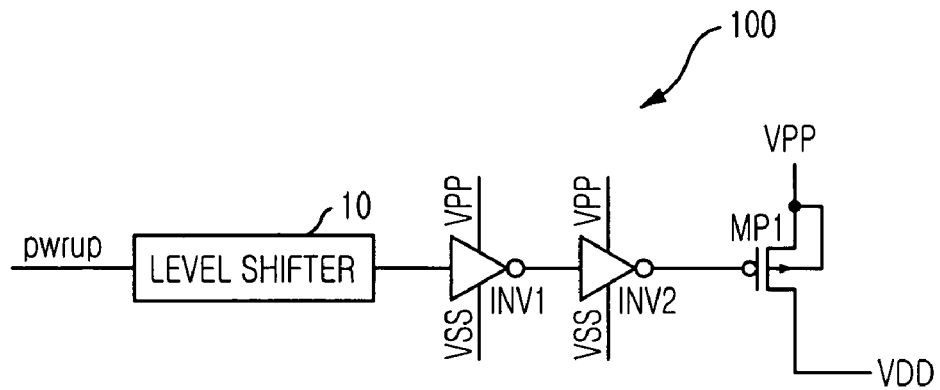
FIG. 1 is a circuit diagram of a conventional internal voltage initializing circuit.
Figure 1:
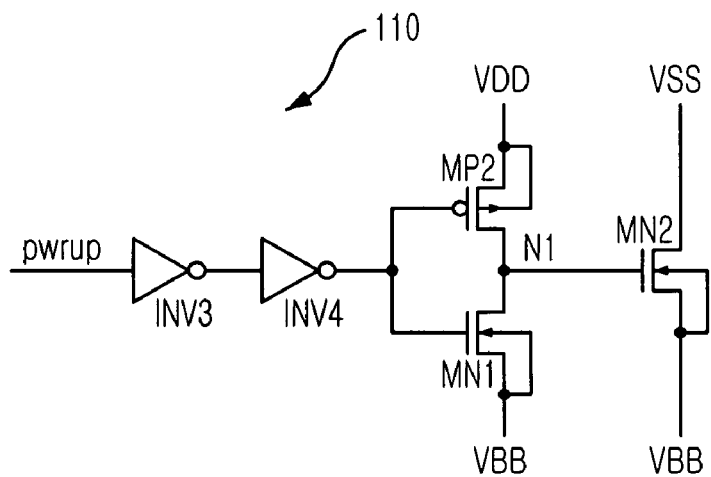
Figure 1:
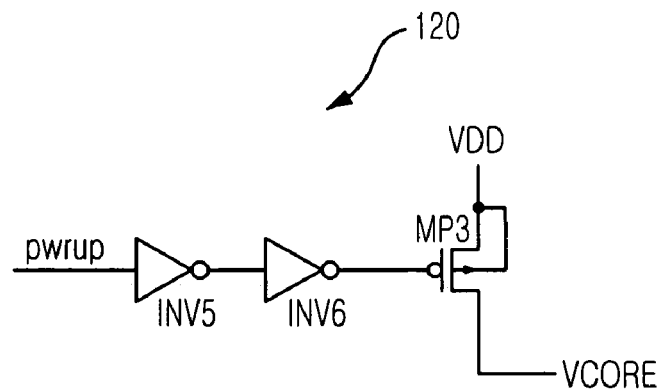
Figure 2A:
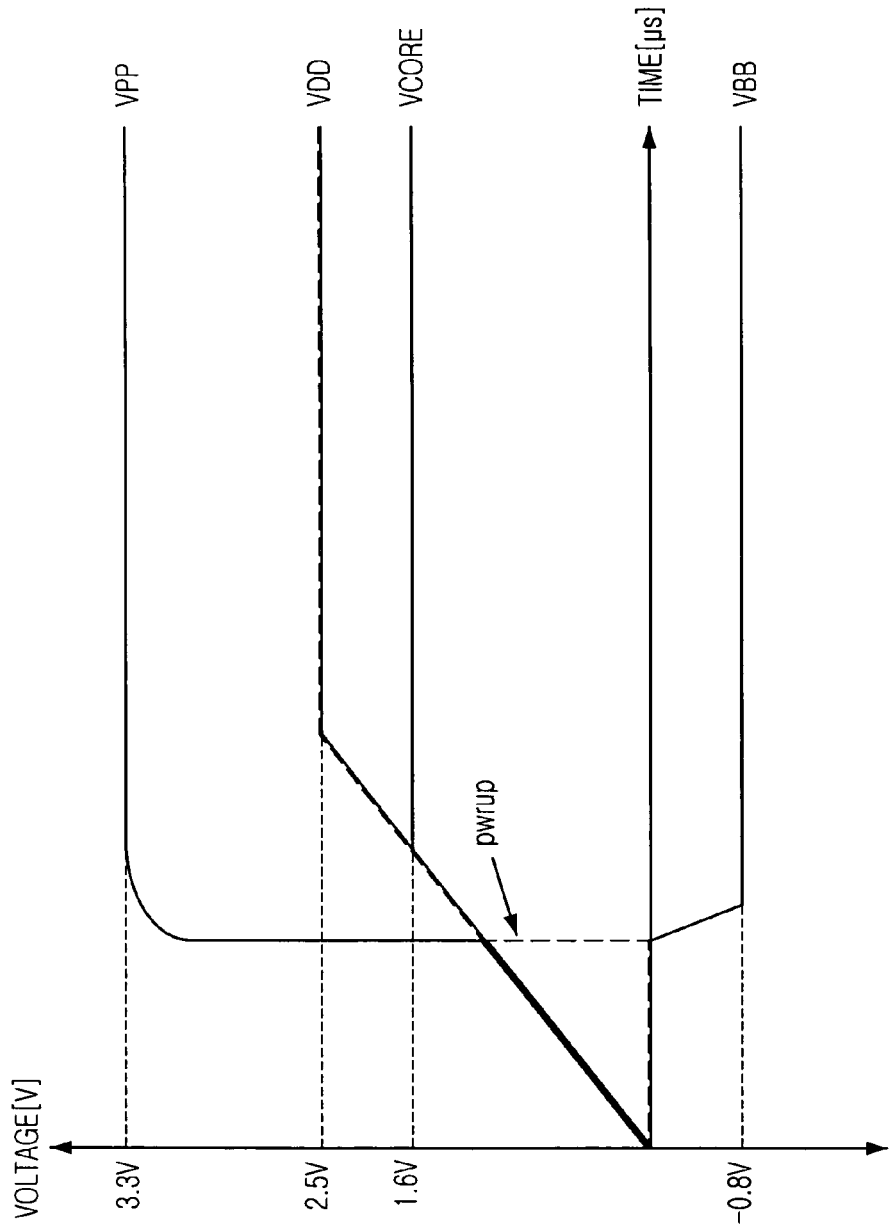
FIG. 2A is an ideal timing diagram of the conventional internal voltages shown in FIG. 1.
Figure 2B:
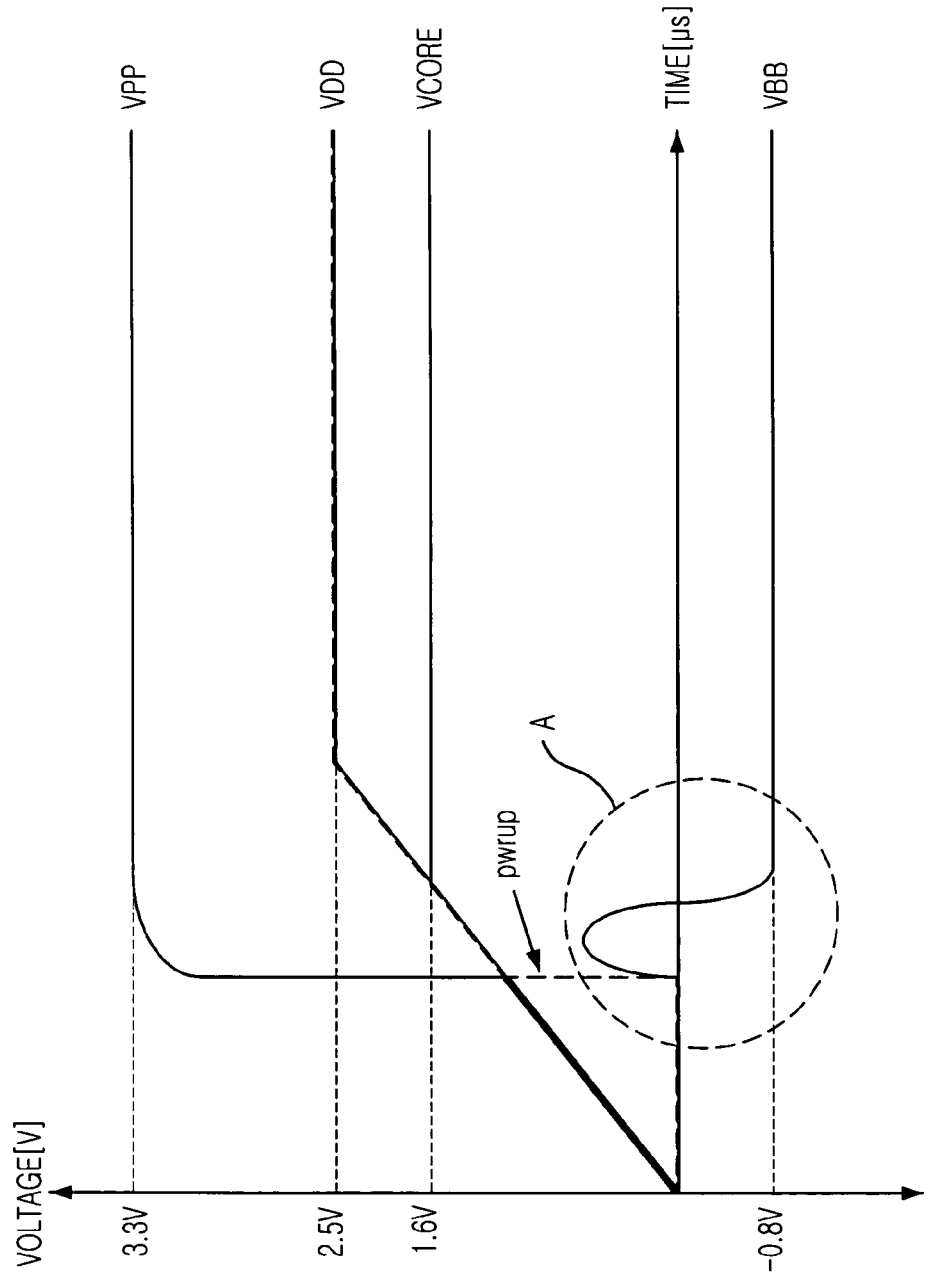
FIG. 2B is an actual timing diagram of the conventional internal voltages shown in FIG. 1.

The VPP initializing unit 200 and the VCORE initializing unit 220 have the same structures as those of FIG. 1 so that further detail descriptions for them will be abbreviated herein. It is noted that the same reference numerals refer to the same elements.

The VBB initializing unit 210 in accordance with the present invention includes a delay unit 20 receiving a power-up signal pwrup, an inverter INV7 receiving an output signal of the delay unit 20, an inverter INV8 receiving an output signal of the inverter INV7, a PMOS transistor MP4 connected between a VDD terminal and a node N2 and having a gate receiving an output signal of the inverter INV8, an NMOS transistor MN3 connected between a VBB terminal and the node N2 and having a gate receiving an output signal of the inverter INV8, and an NMOS transistor MN4 connected between a VSS terminal and the VBB terminal and having a gate receiving a signal outputted through the node N2.

Here, the inverters INV7 and INV8 constitute a buffer, and the PMOS transistor MP4 and the NMOS transistor MN3 constitute an inverter.

That is, in comparison with the conventional internal voltage initializing circuit, the internal voltage initializing circuit of the present invention further includes the delay unit 20 for delaying the power-up signal by a predetermined time. The delay unit 20 may be configured with an inverter chain, a resistor, a capacitor, a MOS transistor, etc.

Figure 4:
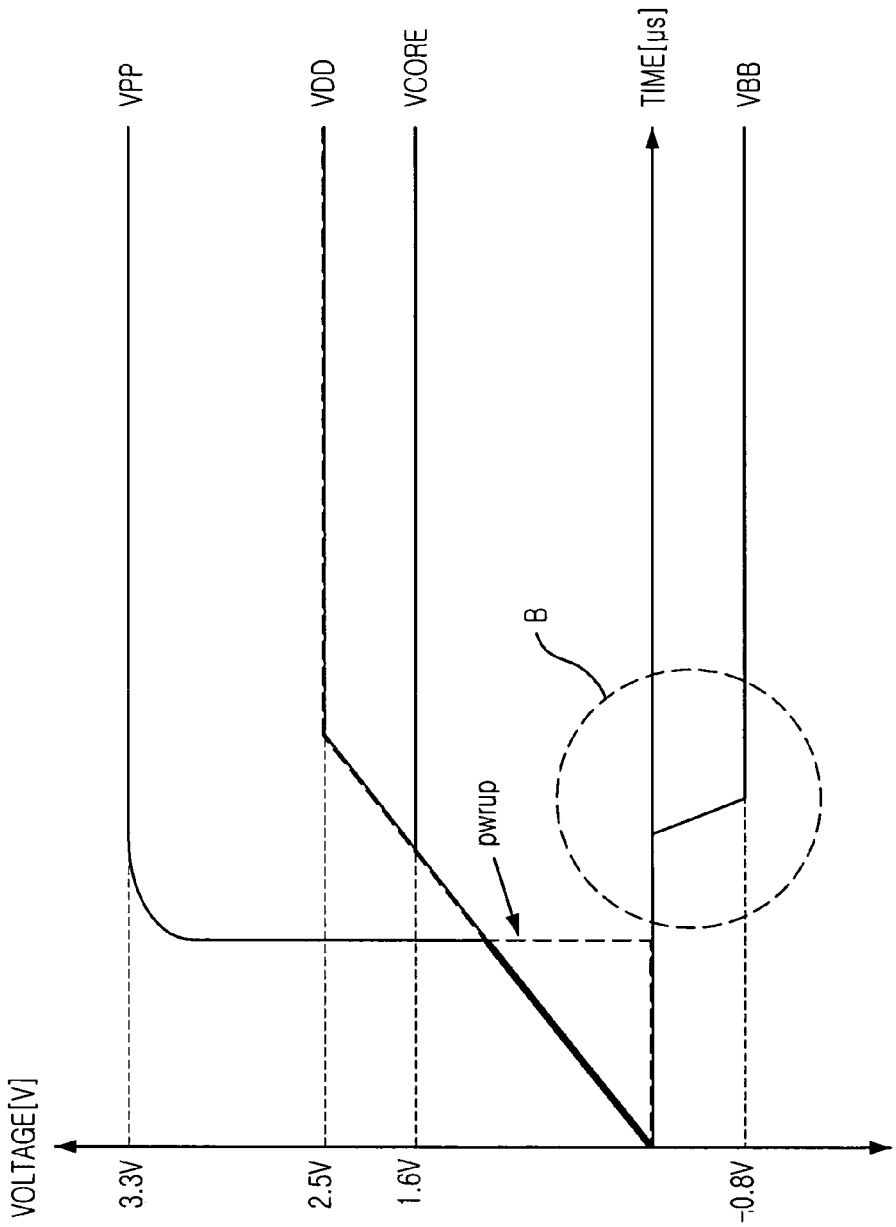
FIG. 4 is an actual timing diagram of the internal voltage shown in FIG. 3 in accordance with the present invention.

FIG. 4 is an actual timing diagram of the internal voltages shown in FIG. 3 in accordance with the preferred embodiment of the present invention.

Referring to FIG. 4, in a time period when the power supply voltage (VDD) does not reach a specific level (about 1.3 V), the power-up signal pwrup maintains a logic low level.

If the power-up signal pwrup is a logic low level, the PMOS transistor MP1 of the VPP initializing unit 200 is turned on to connect the VDD terminal and the VPP terminal, and the NMOS transistor MN4 of the VBB initializing unit 210 is turned on to connect the VSS terminal and the VBB terminal. Also, the PMOS transistor MP3 of the VCORE initializing unit 220 is turned on to connect the VDD terminal and the VCORE terminal.

Therefore, in the time period when the power-up signal pwrup is a logic low level, the high voltage (VPP) and the core voltage (VCORE) rise along the VDD level and the back bias voltage (VBB) becomes the ground voltage (VSS).

If the power supply voltage (VDD) continues to rise and then reaches the specific level (about 1.3 V), the power-up signal pwrup changes to a logic high level.

If the power-up signal pwrup becomes a logic high level, the PMOS transistor MP1 of the VPP initializing unit 200 is turned off to disconnect the VDD terminal and the VPP terminal. Thus, a VPP pump (not shown) performs a pumping operation and raises the high voltage to its own target level, i.e., 3.3 V. The PMOS transistor MP3 of the VCORE initializing unit 110 is turned off to disconnect the VDD terminal and the VCORE terminal and is set to its own target level (1.6 V) by a VCORE driver (not shown).

If the power-up signal pwrup changes to a logic high level, an instant reaction does not occur due to the delay unit 20 of the VBB initializing unit 210 and the NMOS transistor MN4 is turned off after a delay time of the delay unit 20. Thus, the VSS terminal and the VBB terminal are disconnected and the VSS pump (not shown) performs a pumping operation to falls down to its own target level (−0.8 V) (refer to a portion "B").

At this time, when the VPP pump starts the pumping operation, the NMOS transistor MN4 of the VBB initializing unit 210 is in a turned-on state. Therefore, the VBB terminal and the VSS terminal maintain the disconnected state. Thus, even when the high voltage (VPP) rapidly increases due to the pumping operation of the VPP pump, potential of the back bias voltage (VBB) does not increases to a positive level.

Meanwhile, the delay unit 20 has only to have a predetermined delay time so that the high voltage (VPP) can be stabilized from the transition time of the power-up signal pwrup.

Also, other switching elements instead of the MOS transistors can be used to connect/disconnect the voltage terminals.

In accordance with the present invention, when the power is supplied, the abnormal increase of the back bias voltage (VBB) can be prevented, such that the latch-up does not occur. Also, the reliability and operation characteristics of the semiconductor memory device can be improved.

The present application contains subject matter related to the Korean patent application No. KR 2003-100447, filed in the Korean Patent Office on Dec. 30, 2003, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An internal voltage initializing circuit for use in a semiconductor memory device, comprising:
a high voltage initializing unit for selectively connecting a power supply voltage terminal to a high voltage terminal and generating a high voltage in response to a power-up signal; and
a back bias voltage initializing unit for selectively connecting a ground terminal to a back bias voltage terminal and generating a back bias voltage in response to a signal produced by delaying the power-up signal by a predetermined delay time,
wherein the back bias voltage initializing unit does not generate the back bias voltage until a level of the high voltage is raised to a target level and generates the back bias voltage after the level of the high voltage is raised to the target level by preventing a level of the back bias voltage from increasing until the level of the high voltage is raised to the target level,
wherein the back bias voltage initializing unit includes:
a delay unit for delaying the power-up signal by the predetermined delay time to prevent the level of the back bias voltage from increasing until the level of the high voltage is raised to the target level;
a first buffer for buffering an output signal of the delay unit;
an inverter receiving an output signal of the first buffer; and
a first switch for selectively connecting the ground terminal to the back bias voltage terminal in response to an output signal of the inverter.

2. The internal voltage initializing circuit as recited in claim 1, wherein the high voltage initialing unit includes:
a level shifter receiving the power-up signal;
a second buffer for buffering an output signal of the level shifter; and
a second switch for selectively connecting the power supply voltage terminal to the high voltage terminal in response to an output signal of the second buffer.

3. The internal voltage initializing circuit as recited in claim 1, wherein the delay unit is configured with at least one of an inverter chain, a resistor, a capacitor, a MOS transistor.

4. The internal voltage initializing circuit as recited in claim 2, wherein the second switch is a PMOS transistor connected between the power supply voltage terminal and the high voltage terminal, the PMOS transistor having a gate receiving the output signal of the second buffer.

5. The internal voltage initializing circuit as recited in claim 1, wherein the first switch is an NMOS transistor connected between the ground terminal and the back bias voltage terminal, the NMOS transistor having a gate receiving the output signal of the inverter.

6. A driving method of an internal voltage initializing circuit for use in a semiconductor memory device, comprising the steps of:
connecting a power supply voltage terminal and a high voltage terminal, and connecting a ground voltage terminal and a back bias voltage terminal;
disconnecting the power supply voltage terminal and the high voltage terminal;
performing a pumping operation for raising a voltage level of the high voltage terminal to a target voltage level in order to generate a high voltage;
disconnecting the ground voltage terminal and the back bias voltage terminal after a predetermined delay time from a time point when the power supply voltage terminal and the high voltage terminal are disconnected; and
performing a pumping operation for falling down a voltage level of the back bias voltage terminal in order to generate a back bias voltage,
wherein the back bias voltage is not generated until the voltage level of the high voltage is raised to the target level and generated after the voltage level of the high voltage is raised to the target level by preventing a voltage level of the back bias voltage from increasing until the voltage level of the high voltage is raised to the target level.

7. A driving method of an internal voltage initializing circuit for use in a semiconductor memory device, comprising the steps of:
connecting a power supply voltage to a high voltage terminal, and connecting a ground terminal to a back bias voltage terminal;
disconnecting the power supply voltage terminal from the high voltage terminal in response to a power-up signal;
performing a pumping operation for raising a voltage level of the high voltage terminal to a target voltage level in order to generate a high voltage;

delaying the power-up signal for a predetermined delay time;

disconnecting the ground voltage terminal from the back bias voltage terminal in response to a delayed power-up signal; and performing a pumping operation for falling down a voltage level of the back bias voltage terminal in order to generate a back bias voltage, wherein the predetermined delay time is a time for stabilizing a high voltage from a transition time of the power-up signal and the back bias voltage is not generated until the voltage level of the high voltage is raised to the target level and generated after the voltage level of the high voltage is raised to the target level by preventing a level of the back bias voltage from increasing until the voltage level of the high voltage is raised to the target level.

8. The internal voltage initializing circuit as recited in claim 1, wherein the delay unit comprises a chain of inverters, and the first buffer comprises two serially connected inverters, and wherein the delay unit, first buffer and the inverter receiving the output signal of the first buffer, are serially connected so as to comprise at least six serially connected inverters.

9. The internal voltage initializing circuit as recited in claim 1, wherein the delay unit comprises a resistor which is serially connected with the first buffer that comprises two serially connected inverters.

10. The internal voltage initializing circuit as recited in claim 1, wherein the delay unit comprises a capacitor which is serially connected with the first buffer that comprised two serially connected inverters.

11. The internal voltage initializing circuit as recited in claim 1, wherein the delay unit comprises a MOS transistor which is serially connected with the first buffer that comprises two serially connected inverters.

12. The internal voltage initializing circuit as recited in claim 2, the predetermined delay time includes all operation time caused by the level shifter, the second buffer, and the second switch.

\* \* \* \* \*